US009679962B2

(12) United States Patent
Xu et al.

(10) Patent No.: US 9,679,962 B2
(45) Date of Patent: Jun. 13, 2017

(54) FINFET AND METHOD OF MANUFACTURING THE SAME

(71) Applicant: INSTITUTE OF MICROELECTRONICS, CHINESE ACADEMY OF SCIENCES, Beijing (CN)

(72) Inventors: Miao Xu, Beijing (CN); Huilong Zhu, Poughkeepsie, NY (US); Lichuan Zhao, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/814,022

(22) Filed: Jul. 30, 2015

(65) Prior Publication Data

US 2016/0190236 A1 Jun. 30, 2016

(30) Foreign Application Priority Data

Dec. 29, 2014 (CN) .......................... 2014 1 0838568

(51) Int. Cl.
| H01L 29/06 | (2006.01) |
| H01L 21/265 | (2006.01) |
| H01L 21/82 | (2006.01) |
| H01L 27/092 | (2006.01) |
| H01L 21/8238 | (2006.01) |
| H01L 29/66 | (2006.01) |

(52) U.S. Cl.
CPC .... *H01L 29/0638* (2013.01); *H01L 21/26586* (2013.01); *H01L 21/823807* (2013.01); *H01L 21/823821* (2013.01); *H01L 27/0924* (2013.01); *H01L 29/0649* (2013.01); *H01L 29/66545* (2013.01)

(58) Field of Classification Search
CPC .......... H01L 29/0638; H01L 21/26586; H01L 27/0924; H01L 21/823878; H01L 29/0649; H01L 29/66545
USPC ........................................................ 257/369
See application file for complete search history.

(56) References Cited

U.S. PATENT DOCUMENTS

| 9,082,698 | B1* | 7/2015 | Joshi | ................. | H01L 29/66795 |
| 2002/0094647 | A1* | 7/2002 | Woerlee | ............ | H01L 21/76895 |
| | | | | | 438/289 |
| 2011/0207309 | A1* | 8/2011 | Izumida | ............ | H01L 29/66818 |
| | | | | | 438/514 |
| 2013/0049080 | A1* | 2/2013 | Okano | .............. | H01L 29/66795 |
| | | | | | 257/288 |
| 2014/0252475 | A1* | 9/2014 | Xu | ........................ | H01L 29/785 |
| | | | | | 257/347 |

(Continued)

*Primary Examiner* — Moazzam Hossain
*Assistant Examiner* — Omar Mojaddedi
(74) *Attorney, Agent, or Firm* — Leydig, Voit & Mayer, Ltd.

(57) ABSTRACT

There is provided a method of manufacturing a Fin Field Effect Transistor (FinFET). The method may include: forming a fin on a semiconductor substrate; forming a dummy device including a dummy gate on the fin; forming an interlayer dielectric layer to cover regions except for the dummy gate; removing the dummy gate to form an opening; implanting ions to form a Punch-Through-Stop Layer (PTSL) in a portion of the fin directly under the opening, while forming reflection doped layers in portions of the fin on inner sides of source/drain regions; and forming a replacement gate in the opening.

8 Claims, 14 Drawing Sheets

(56) References Cited

U.S. PATENT DOCUMENTS

| | | | |
|---|---|---|---|
| 2015/0008490 A1* | 1/2015 | Strain | H01L 29/66795 257/288 |
| 2015/0084127 A1* | 3/2015 | Zhu | H01L 29/42384 257/345 |
| 2016/0005735 A1* | 1/2016 | Costrini | H01L 27/0886 257/401 |

* cited by examiner

US 9,679,962 B2

FINFET AND METHOD OF MANUFACTURING THE SAME

CROSS-REFERENCE TO RELATED APPLICATION(S)

This application claims priority to Chinese Patent Application No. 201410838568.0, filed on Dec. 29, 2014, entitled "FinFETs and methods of manufacturing the same," which is incorporated herein by reference in its entirety.

TECHNICAL FIELD

The present disclosure relates to the field of semiconductor manufacture, and in particular, to a Fin Field Effect Transistor (FinFETs) and a method of manufacturing the same.

BACKGROUND

With increasing integration of semiconductor devices, channel lengths decrease continuously for MOSFETs. A series of effects that are negligible in a long channel model of the MOSFET become increasingly obvious, or even become dominant factors influencing performances of the devices. These effects are generally referred to as short channel effects, which may deteriorate electrical performances of the devices. For example, the short channel effects may cause problems such as decreased gate threshold voltage, increased power consumption, degraded signal-to-noise ratio, or the like.

Currently, in order to solve the problems of the short channel effects, a three-dimensional (3C) device structure of FinFET is proposed. The FinFET is a transistor having a fin-type channel structure, which uses several surfaces of a thin fin as channels, so as to avoid the short channel effects in the conventional transistors while increasing an operation current.

In the existing manufacture processes for the FinFET, in order to reduce a leakage current between the source region and the drain region, a Punch-Trough-Stop Layer (PTSL) may be formed at a lower portion of the fin. Generally, the PTSL is formed in the fin by ion implantation after the fin and an isolation layer is formed. However, there is a problem as follows. Specifically, due to non-uniformity of doping concentration in the PTSL at edges of the fin, the leakage current between the source region and the drain region increases and the short channel effects become more significant with continuous decreasing of the gate length (especially when less than 20 nm).

SUMMARY

In view of the disadvantages in the related art, the present disclosure aims to provide, among others, a FinFET and a manufacturing method thereof, to reduce junction leakage and a junction capacitance and thus to improve the short channel effects.

According to an aspect of the present disclosure, there is provided a method of manufacturing a Fin Field Effect Transistor (FinFET), comprising: forming a fin on a semiconductor substrate; forming a dummy device including a dummy gate on the fin; forming an interlayer dielectric layer to cover regions except for the dummy gate; removing the dummy gate to form an opening; implanting ions to form a Punch-Through-Stop Layer (PTSL) in a portion of the fin directly under the opening, while forming reflection doped layers in portions of the fin on inner sides of source/drain regions; and forming a replacement gate in the opening.

According to an embodiment, the ions may be implanted at a vertical angle.

According to an embodiment, the ions may be implanted at a dosage in a range of 1E12 cm$^{-2}$ to 1E14 cm$^{-2}$ and energy in a range of 10 KeV to 150 KeV.

According to an embodiment, a first type of dummy device and a second type of dummy device may be formed on respective fins.

According to an embodiment, a first replacement gate and a second replacement gate may be formed in respective openings.

According to a further aspect of the present disclosure, there is provided a Fin Field Effect Transistor (FinFET), comprising: a semiconductor substrate; a fin formed on the substrate; a device structure including a gate on the fin; and a Punch-Through-Stop Layer (PTSL) in a portion of the fin directly under the gate and reflection doped layers in portions of the fin on inner sides of source/drain regions, wherein the reflection doped layers have the same doping type as that of the PTSL.

According to an embodiment of the present disclosure, the device structure may comprise a first type of device structure and a second type of device structure.

According to the embodiments of the present disclosure, after the dummy gate is removed, the PTSL is formed by ion implantation, so that the PTSL is formed in only a portion of the fin directly under the gate, without doped region of the PTSL formed beneath the source/drain regions, so as to reduce the junction leakage and the junction capacitance. When ions are implanted, due to presence of a spacer of the dummy device, ions close to the spacer are reflected and implanted into portions of the fin on inner sides of the source/drain regions beneath the spacer, to form the reflection doped regions on opposite sides of the channel. These doped regions are beneficial to improve the threshold voltage of the device. Especially when the device scales down continuously, the reflection doped regions on the opposite sides of the channel become increasingly closer to each other, which can prevent threshold voltage roll-off and improve the short channel effects of the device.

BRIEF DESCRIPTION OF THE DRAWINGS

Next, the accompanying drawings showing various embodiments of the present disclosure will be described briefly. Obviously, the accompanying drawings described below are merely some embodiments of the present disclosure. Other embodiments will be readily apparent to those skilled in the art in light of these accompanying drawings without departing from the disclosure.

FIGS. 2-10B are sectional views showing a FinFET at various manufacturing stages according to an embodiment of the present disclosure, wherein FIGS. 2-10 are top views of the FinFET at the various manufacturing stages, FIGS. 2A-10A are sectional views along an AA direction in the respective top views, and FIGS. 5B-10B are sectional views along a BB direction in the respective top views;

DETAILED DESCRIPTION

Figure 1:
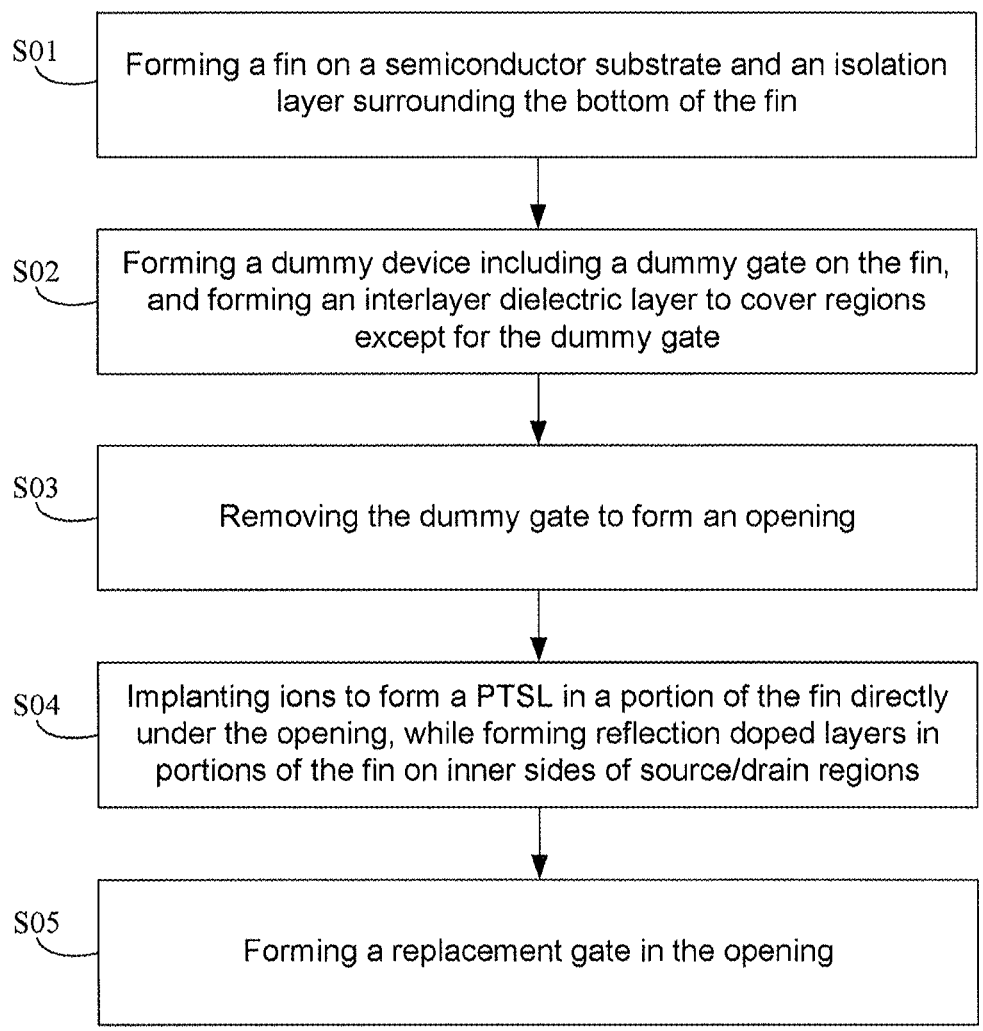
FIG. 1 is a flowchart showing a method of manufacturing a FinFET according to an embodiment of the present disclosure.

In order to make the above objects, features and advantages of the present disclosure more apparent and clearer, embodiments of the present disclosure will be described in detail below in conjunction with accompanying drawings.

Many details are set forth in the following description for thoroughly understanding the present disclosure. However, the present disclosure can also be implemented in other ways different from those described herein. Those skilled in the art can similarly extend the present disclosure without departing from the spirit of the present disclosure, and therefore, the present disclosure is not limited by the embodiments disclosed hereinafter.

Also, the present disclosure is described in detail in conjunction with schematic diagrams. When the embodiments of the present disclosure are described in detail, for convenience of illustration, sectional views representing device structures are not necessarily drawn to scale, and may be locally enlarged. In addition, the diagrams are merely illustrative, instead of limiting the scope of the present disclosure. Further, in practical manufacture, three-dimensional sizes, i.e., length, width, and depth, should be included.

It is to be noted that the drawings with the same serial numbers, such as FIG. 2 and FIG. 2A or FIG. 6 and FIGS. 6A and 6B, are views showing a transistor in different directions at the same manufacture stage. FIGS. 2-10 are top views showing a flow of manufacturing a transistor, FIGS. 2A-10A are sectional views along an AA direction in the respective top views, and FIGS. 5B-10B are sectional views along a BB direction in the respective top views.

According to an aspect of the present disclosure, a method of manufacturing a FinFET is proposed. The method may comprise: forming a fin on a semiconductor substrate; forming a dummy device including a dummy gate on the fin; forming an interlayer dielectric layer to cover regions except for the dummy gate; removing the dummy gate to form an opening; implanting ions to form a Punch-Through-Stop Layer (PTSL) in a portion of the fin directly under the opening, while forming reflection doped layers in portions of the fin on inner sides of source/drain regions; and forming a replacement gate in the opening.

According to embodiments of the present disclosure, after the dummy gate is removed, the PTSL is formed by ion implantation, so that the PTSL is formed in only a portion of the fin directly under the gate, without doped region of the PTSL formed beneath the source/drain regions, so as to reduce the junction leakage and the junction capacitance. When ions are implanted, due to presence of a spacer of the dummy device, ions close to the spacer are reflected and implanted into portions of the fin on inner sides of the source/drain regions beneath the spacer, to form the reflection doped regions on opposite sides of the channel. These doped regions are beneficial to improve the threshold voltage of the device. Especially when the device scales down continuously, the reflection doped regions on the opposite sides of the channel become increasingly closer to each other, which can prevent threshold voltage roll-off and improve the short channel effects of the device.

For better understanding of the technical solutions and technical effects of the present disclosure, embodiments will be described in detail in conjunction with FIG. 1, which is a flowchart showing a manufacturing method.

Figure 4:
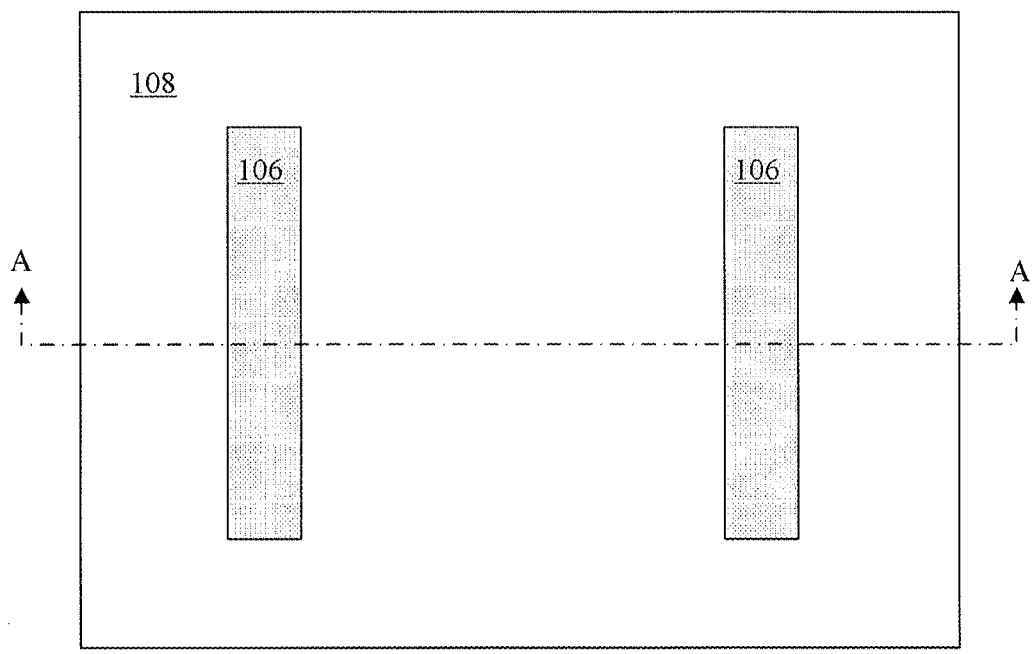
Figure 4A:
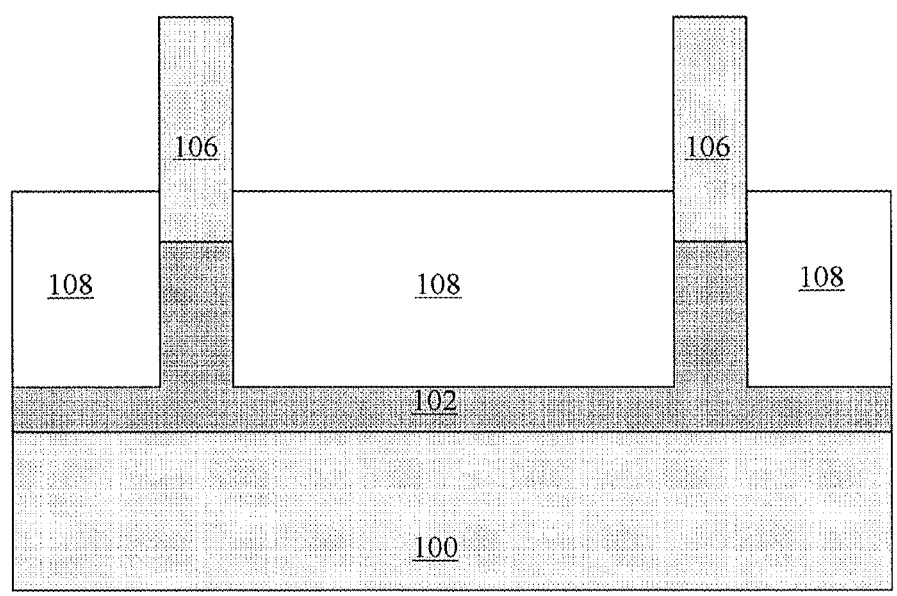

In step S01, a semiconductor substrate 100 having fins 106 formed thereon is provided. The fins 106 have isolation layers 108 formed therebetween, as shown in FIGS. 4 and 4A (a sectional view along an AA direction in FIG. 4). Though there are two fins shown in FIG. 4, there can be more or less fins formed on the substrate 100.

In an embodiment of the present disclosure, the semiconductor substrate 100 may comprise a Si substrate, a Ge substrate, a SiGe substrate, a Silicon On Insulator (SOI), a Germanium On Insulator (GOI) or the like, a substrate including another elemental semiconductor or compound semiconductor, such as GaAs, InP, SiC or the like, a stacked structure, such as Si/SiGe or the like, or another epitaxial structure, such as Silicon Germanium On Insulator (SGOI) or the like.

In the present embodiment, the semiconductor substrate 100 is a bulk Si substrate.

In a specific example, the fins 106 and the isolation layers 108 may be provided in the following way.

Figure 2:
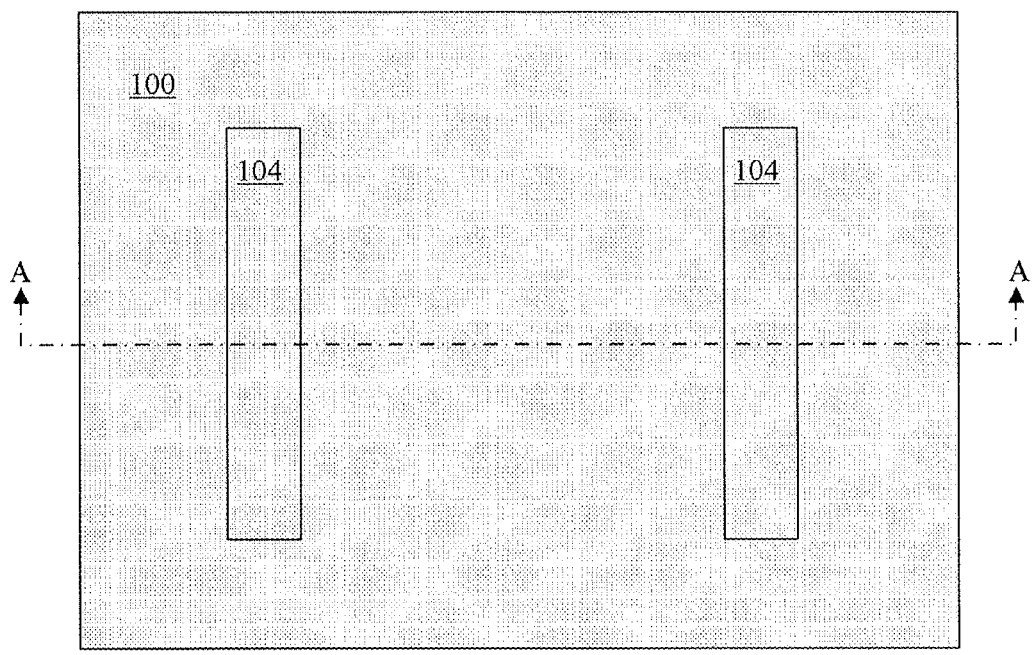
Figure 2A:
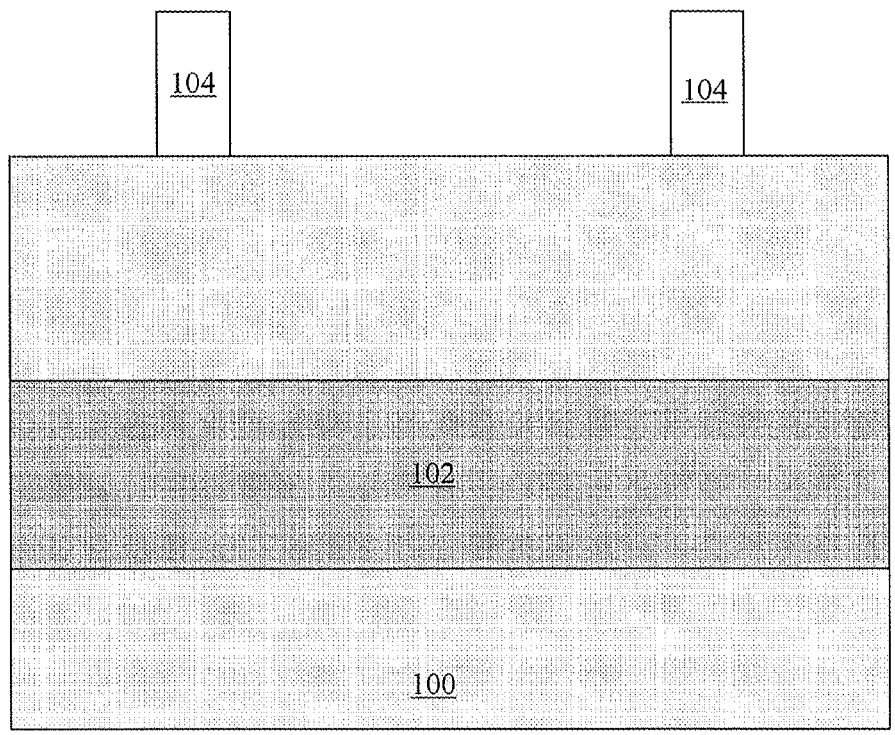

Firstly, well doping may be performed in a conventional way. Specifically, P-type ions may be doped for an N-type device, and N-type ions may be doped for a P-type device. A well region 102 is formed in the bulk Si substrate 100, as shown in FIGS. 2 and 2A (a sectional view along an AA direction in FIG. 2).

Figure 3:
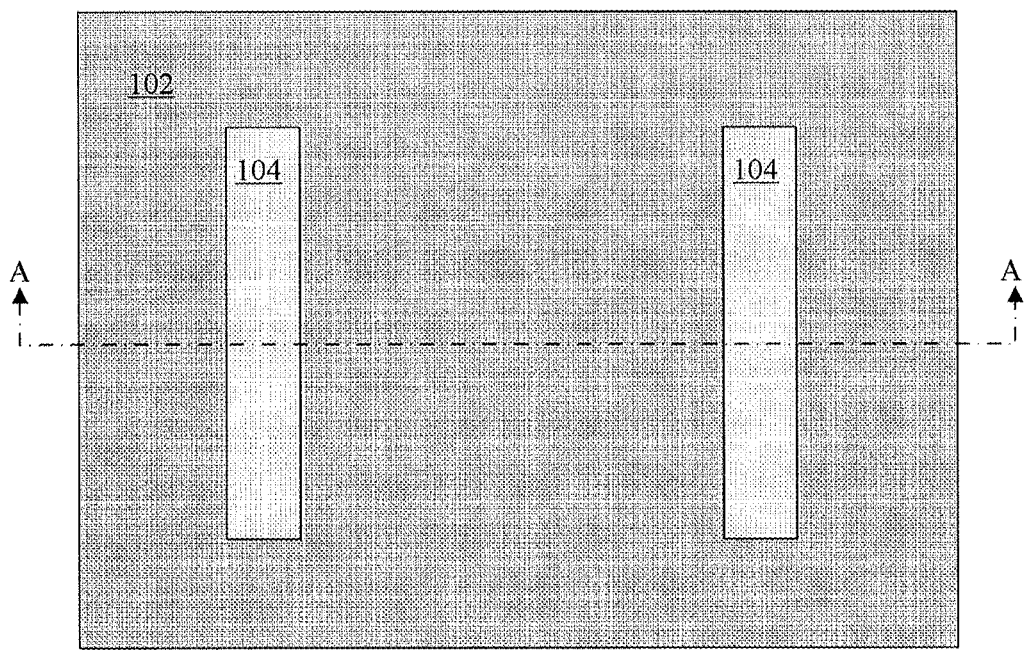
Figure 3A:
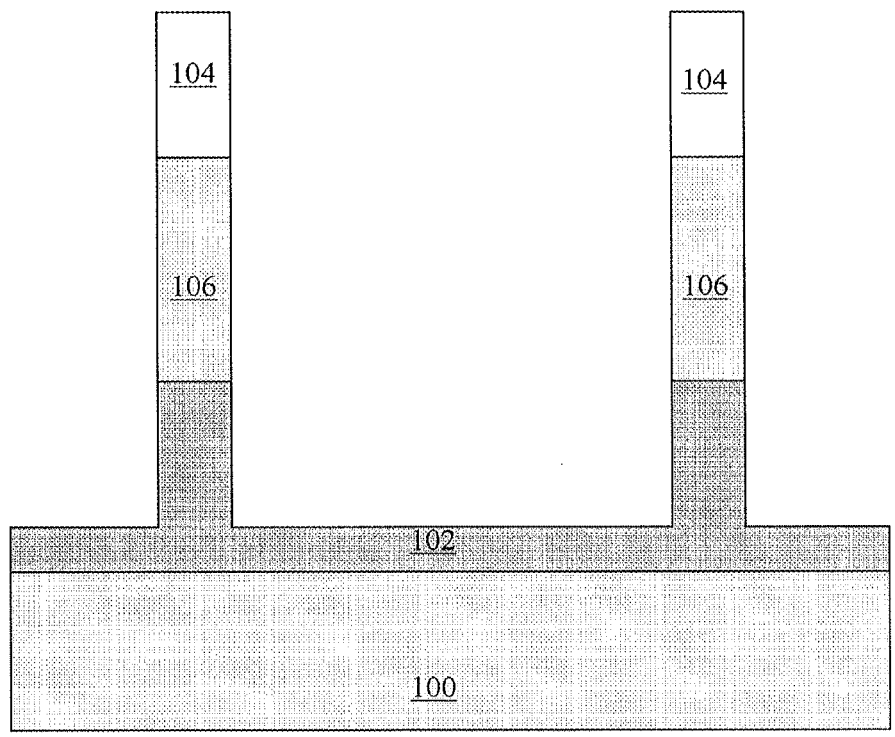

Next, a photoresist layer 104 is formed on the substrate 100. Then, the substrate 100 is etched with an etching technology, such as Reactive Ion Etching (RIE), to form the fins 106 thereon, as shown in FIGS. 3 and 3A. Then, the photoresist layer 104 is removed by being dissolved with a solvent or ashing.

Then, an isolation material of $SiO_2$ is filled and then planarized by, for example, a chemical and mechanical approach. Then a part of the isolation material of $SiO_2$ with a certain thickness may be removed by wet etching, for example, with hydrofluoric acid, to leave the remaining part of the isolation material between the fins 106. Thereby, the isolation layers 108 are formed, as shown in FIGS. 4 and 4A.

Figure 7:
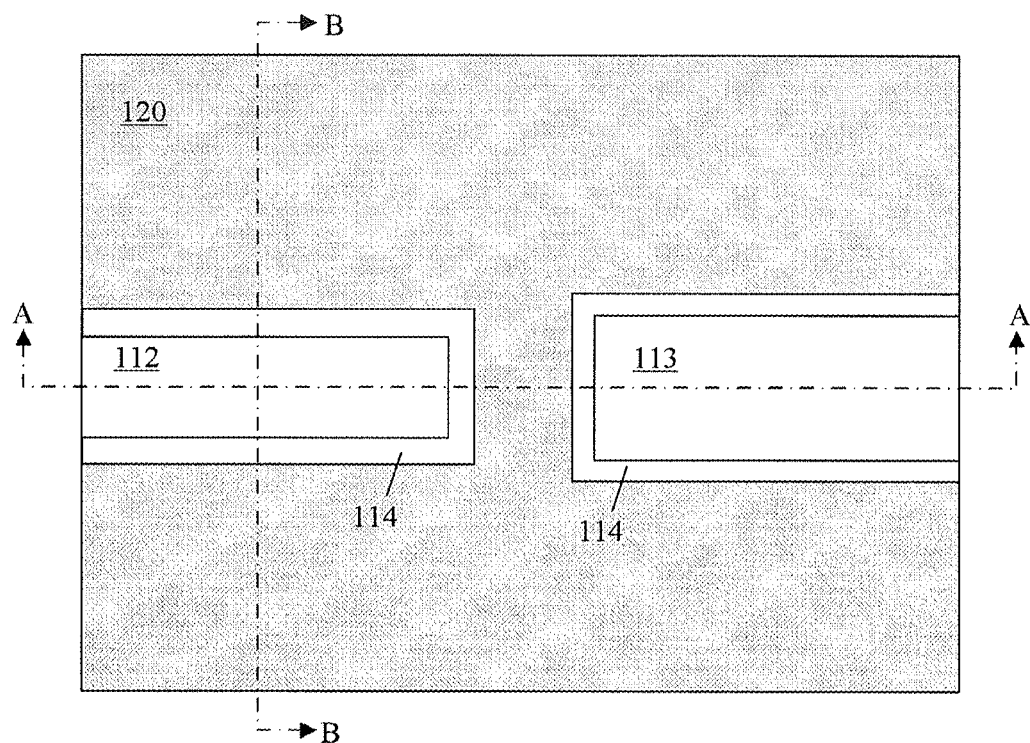
Figure 7A:
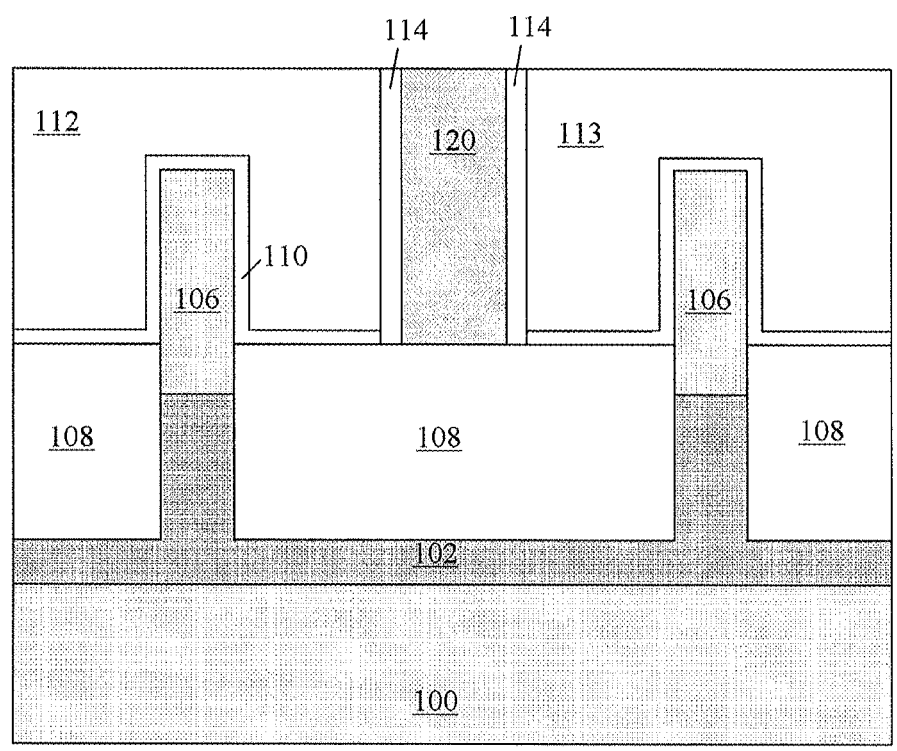
Figure 7B:
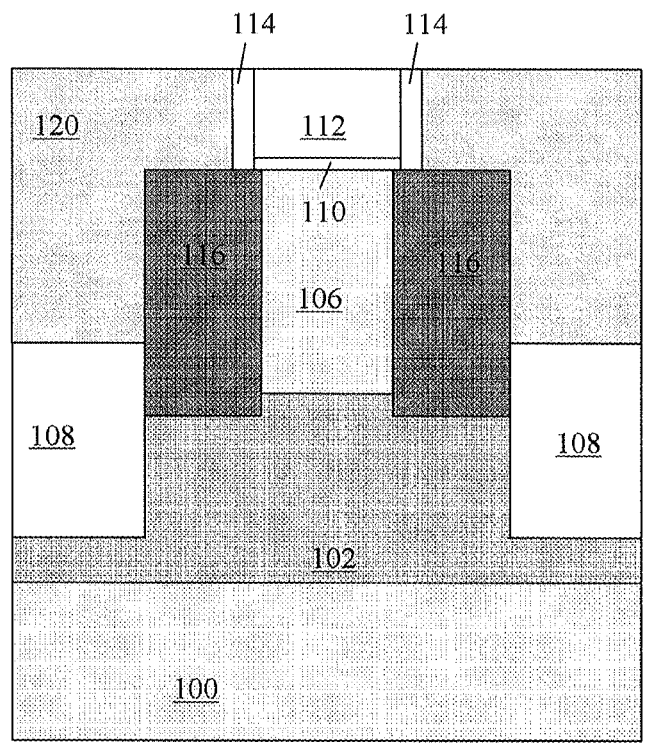

In step S02, dummy devices are formed on the fins, and an interlayer dielectric layer 120 is formed to cover outer sides of the dummy devices, as shown in FIGS. 7 and 7A (a sectional view along an AA direction in FIGS. 7) and 7B (a sectional view along a BB direction in FIG. 7).

In an embodiment of the present disclosure, the dummy device comprises at least a dummy gate crossing the fin, source/drain regions on opposite ends of the fin, and a spacer on the dummy gate. In the present embodiment, a first type of dummy device and a second type of dummy device are formed respectively. The first type of dummy device and the second type of dummy device may be an N-type device and a P-type device, respectively, or may be the same type of devices with different threshold voltages.

Figure 5:
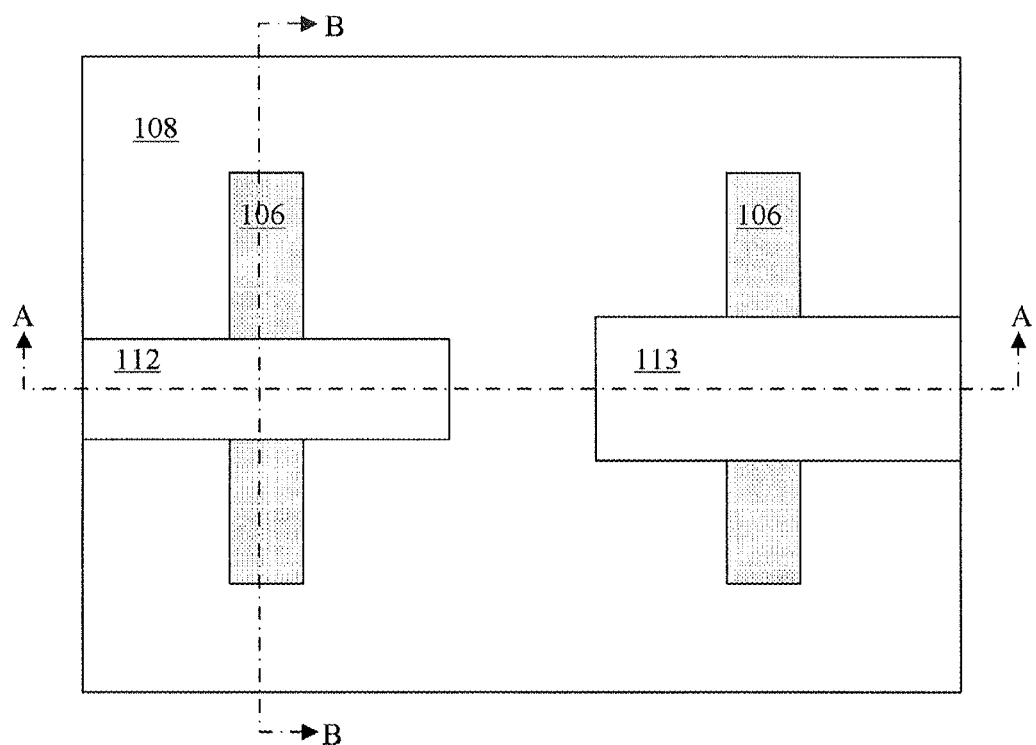
Figure 5A:
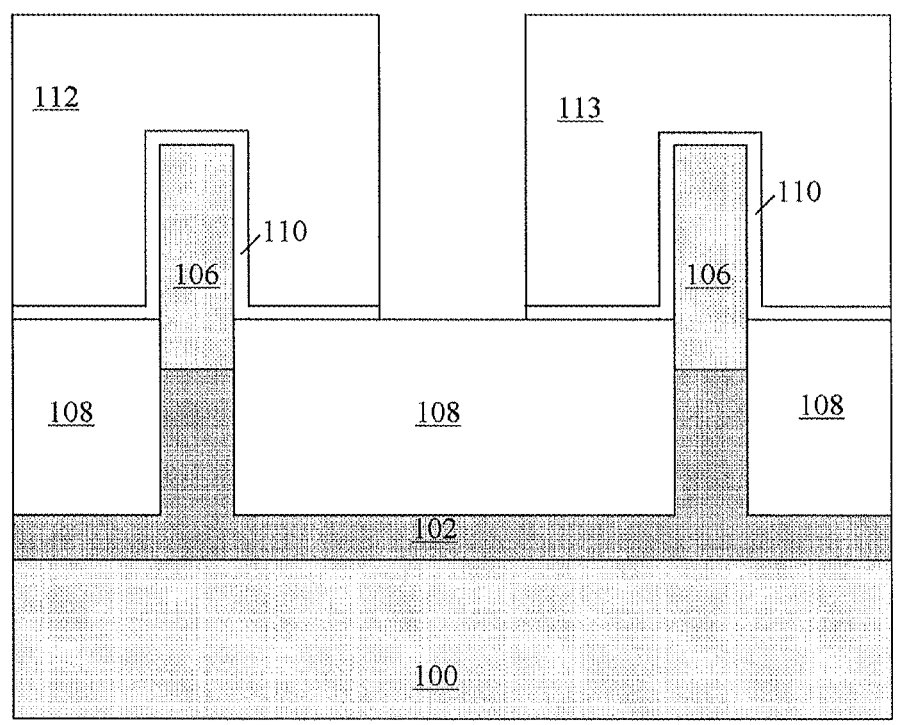
Figure 5B:
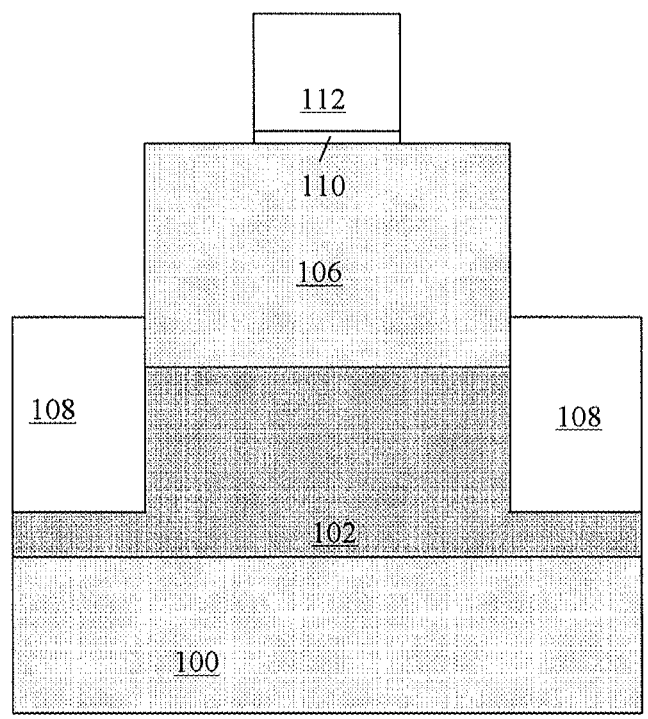

In an embodiment, firstly, a dummy gate dielectric layer and a dummy gate material layer are deposited and patterned, as shown in FIG. 5, 5A (sectional view along an AA direction in FIG. 5), and 5B (sectional view along a BB direction in FIG. 5), to form dummy gate dielectric layers 110, a first dummy gate 112, and a second dummy gate 113. The dummy gate dielectric layer may comprise a thermal oxide layer or other suitable dielectric materials, and the dummy gate may comprise amorphous silicon, polycrystalline silicon, silicon oxide or the like. In the present embodiment, the dummy gate dielectric layer is a thermal oxide layer, and the dummy gate comprises polycrystalline silicon. The first dummy gate 112 and the second dummy gate 113 have different gate lengths, to form different types of devices. The first dummy gate 112 is used to form a first type of dummy device, such as an N-type device, and the second dummy gate 113 is used to form a second type of dummy device, such as a P-type device. The dummy gates with two gate lengths may be formed by patterning with a photoresist layer as a mask or dual-patterning with dual masks.

Figure 6:
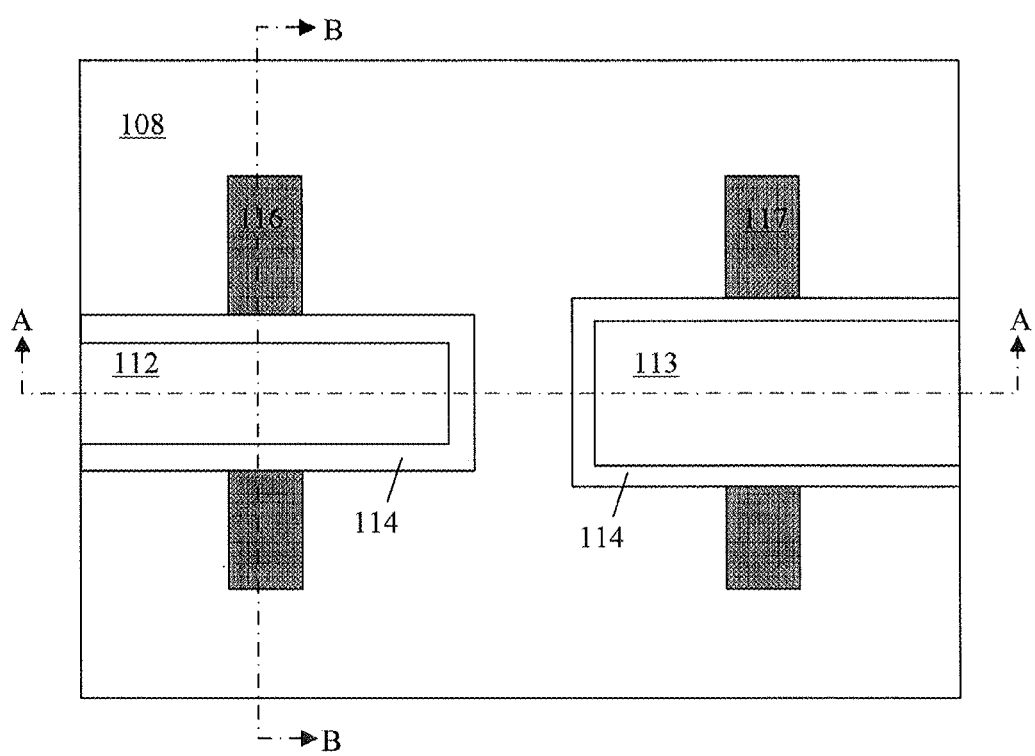
Figure 6A:
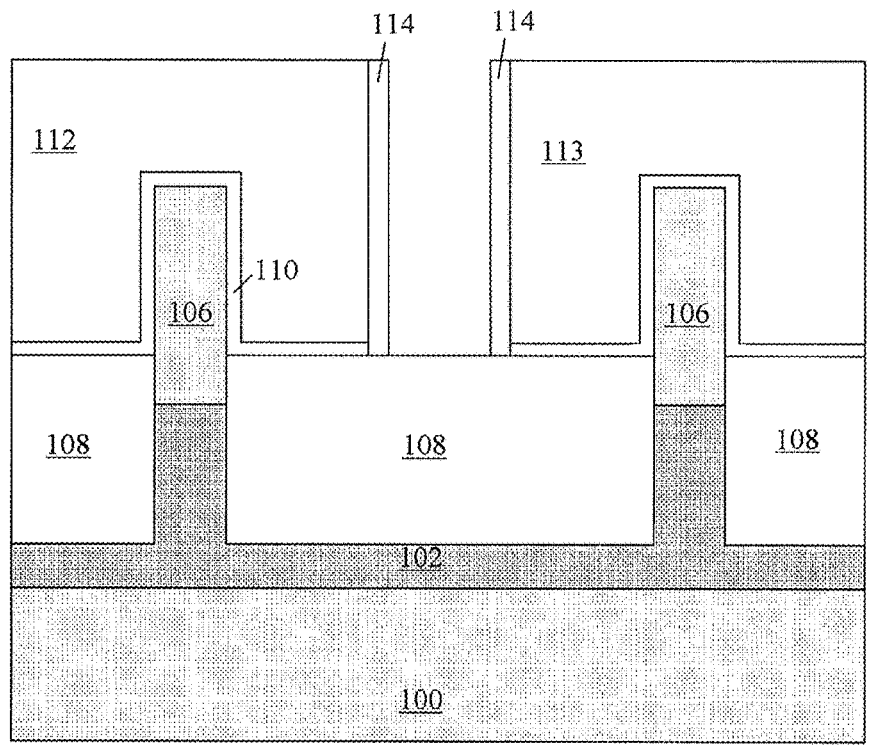

Next, silicon nitride having a thickness of 5-20 nm may be deposited and then etched, to form spacers 114 of silicon nitride only on sidewalls of the first dummy gate and the second dummy gate, respectively. The spacer may have a thickness of more than 10 nm and a height of less than 100 nm, as shown in FIGS. 6, 6A (a sectional view along an AA direction in FIG. 6) and 6B (a sectional view along a BB direction in FIG. 6). In other embodiments, the spacer may comprise other materials, or stacked layers of different materials, such as silicon nitride, silicon oxide, silicon oxynitride, or a combination thereof.

Figure 6B:
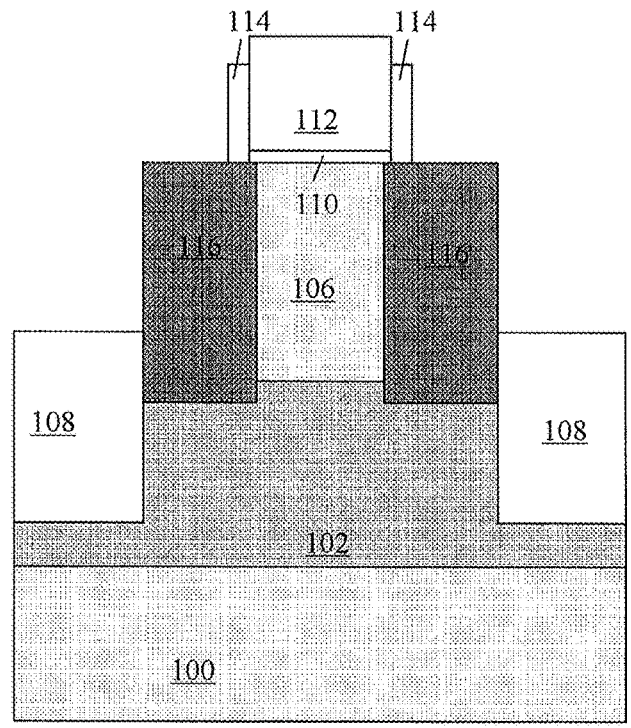

Then, N-type doping and P-type doping are performed respectively, to form first source/drain regions 116 and second source/drain regions 117 on opposite sides of the respective fins. N-type dopants may comprise P, As or the like, and P-type dopants may comprise B, In or the like. The source/drain regions may be formed by ion implantation or epitaxial doping, as shown in FIGS. 6, 6A and 6B. Thus, the first device and the second device according to the present embodiment are formed. The first type of dummy device comprises a gate dielectric layer 110 crossing a fin in a region, a first dummy gate 112 on the gate dielectric layer 110, first source/drain regions 116 in the fin on opposite sides of the first dummy gate 112, and a spacer 114 on the first dummy gate 112, and the second type of dummy device comprises a gate dielectric layer 110 crossing a fin in another region, a second dummy gate 113 on the gate dielectric layer 110, second source/drain regions 117 in the fin on opposite sides of the second dummy gate 113, and a spacer 114 on the second dummy gate.

Next, an interlayer dielectric layer, for example, undoped silicon oxide ($SiO_2$), doped silicon oxide (such as Boro-Silicate Glass (BSG) and Boro-Phospho-Silicate Glass (BPSG)), silicon nitride ($Si_3N_4$), or another low-k dielectric material, is deposited, and then planarized by, for example, Chemical Mechanical Polishing (CMP), until a top surface of the fins is exposed. In this way, the Interlayer Dielectric Layer (ILD) 120 is formed, and the ILD 120 covers the fins and the isolation layers on opposite sides of the dummy gates, as shown in FIGS. 7, 7A (a sectional view along an AA direction in FIG. 7) and 7B (a sectional view along a BB direction in FIG. 7).

Figure 8:
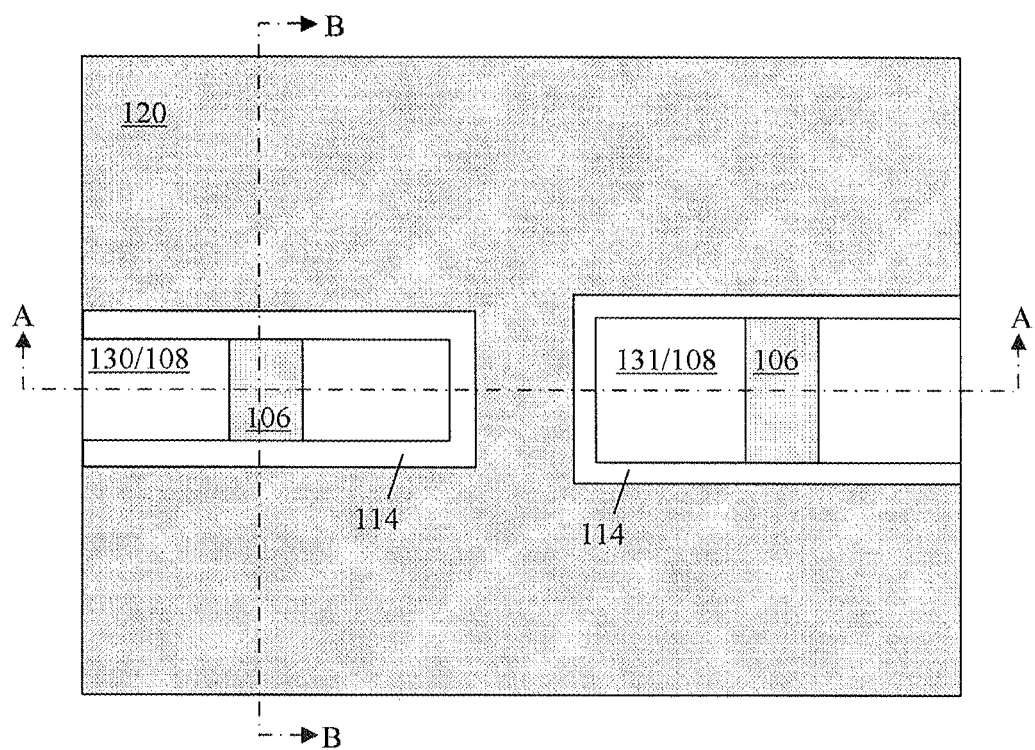
Figure 8A:
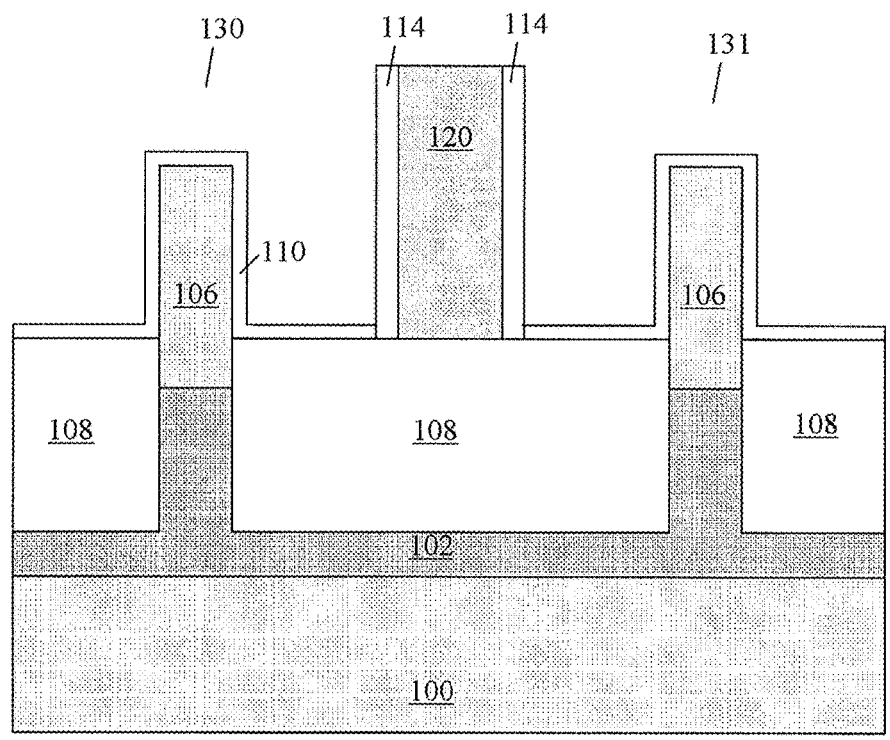

In step S03, the dummy gates are removed to form openings, as shown in FIGS. 8, 8A (a sectional view along an AA direction in FIG. 8) and 8B (a sectional view along a BB direction in FIG. 8).

Figure 8B:
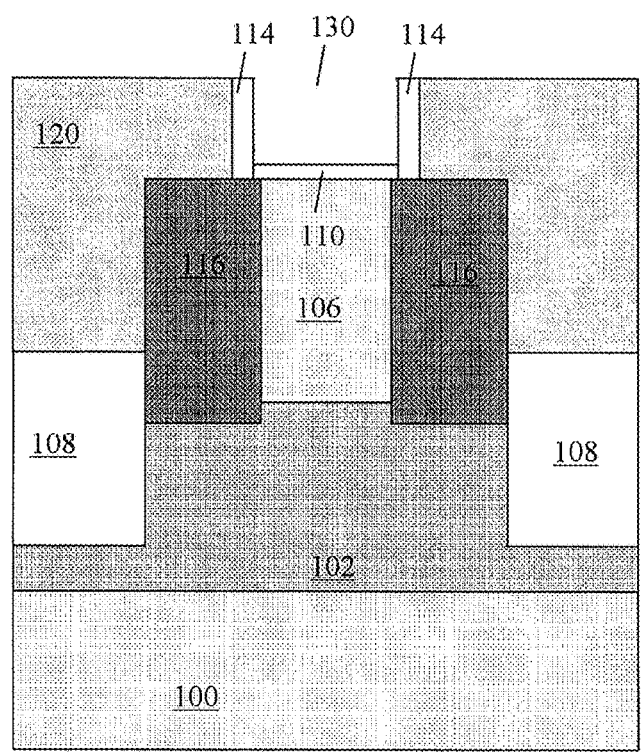

In the present embodiment, the dummy gates and the dummy gate dielectric layers may be removed by wet etching. In an embodiment, the first and second dummy gates of amorphous silicon may be removed through Tetramethylammonium hydroxide (TMAH), so as to form a first opening 130 and a second opening 131. These openings expose the fins 106 and the isolation layers 108 thereunder, as shown in FIGS. 8, 8A and 8B.

Figure 9:
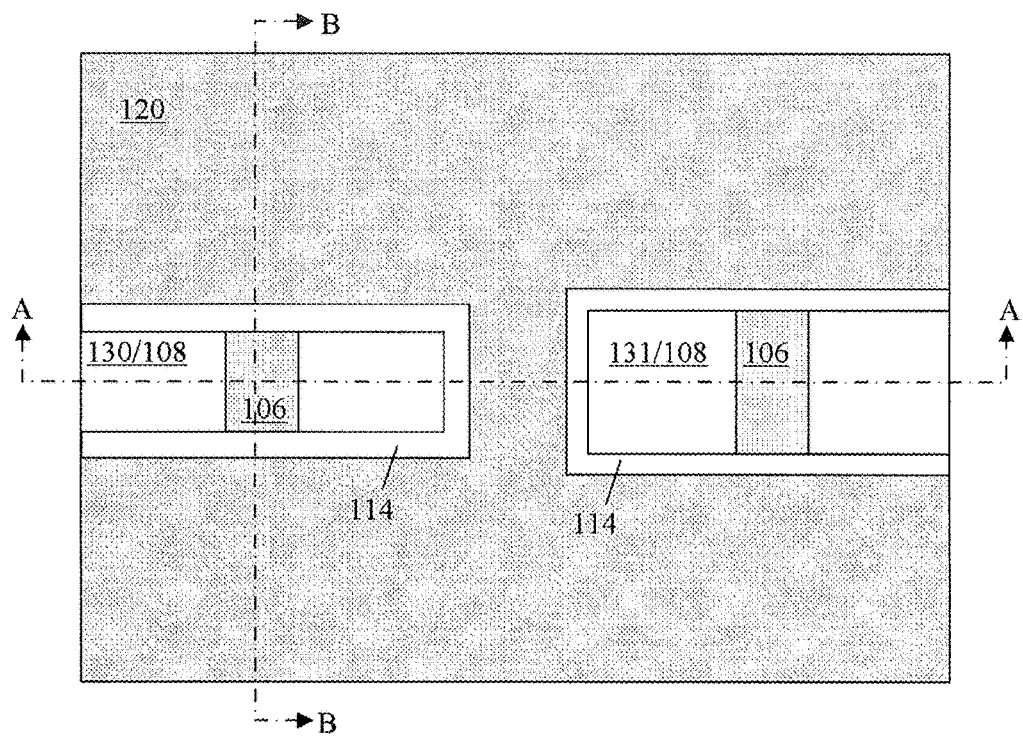
Figure 9A:
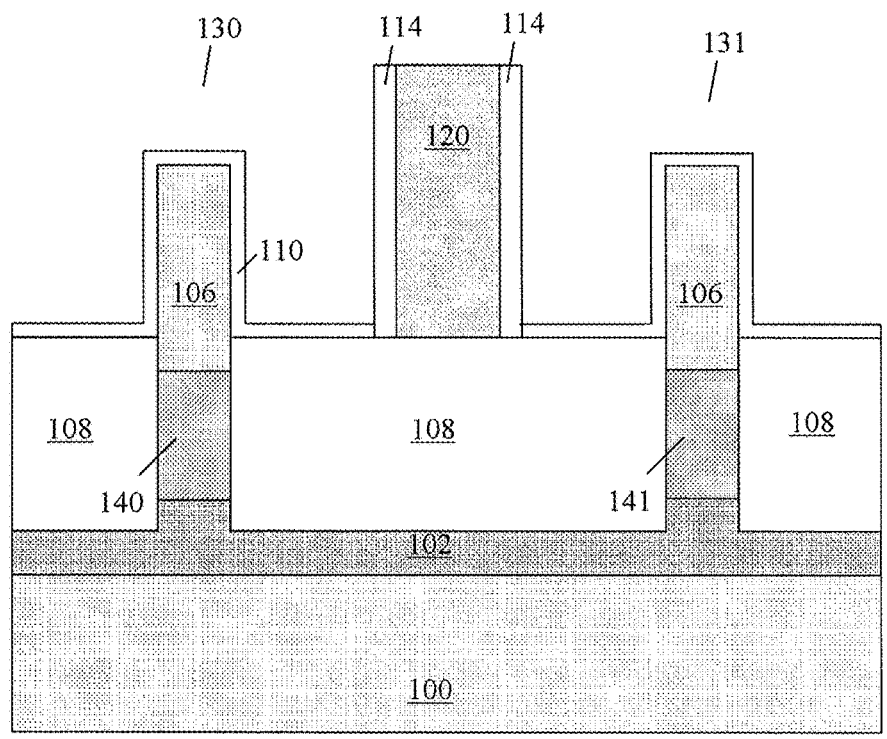

In step S04, ion implantation is performed to form a PTSL 140 in a portion of the fin directly under the opening, and also reflection doped regions 142 are formed in portions of the fin on inner sides of the source/drain regions, as shown in FIG. 9, 9A (a sectional view along an AA direction in FIG. 9) and 9B (a sectional view along a BB direction in FIG. 9).

In the present disclosure, the ion implantation for the PTSL is performed after the dummy gates are removed. P-type dopants, for example, B, In, $BF_2$ or the like, may be implanted for the N-type device, and N-type dopants, for example, P, As or the like, may be implanted for the P-type device.

Figure 9B:
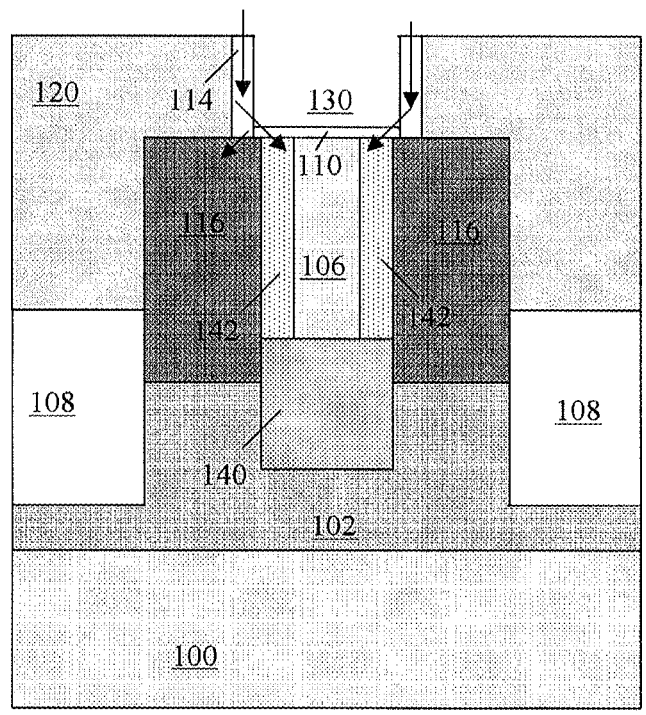

In the present embodiment, ions may be implanted respectively, and are annealed and activated together to form a first PTSL 140 and a second PTSL 141 beneath the first opening 130 and the second opening 131, respectively. The ions may be implanted at an implantation dosage in a range of 1E12 $cm^{-2}$ to 1E14 $cm^{-2}$ and implantation energy in a range of 10 KeV to 150 KeV, and at a small implantation angle, for example, an incident angle in a range of 0° to 6°. With the continuous scaling down of the fins, ion implantation is preferably implemented at an angle of 0°, i.e., the ions are implanted perpendicularly to the fins. A part of the ions are reflected from the isolation layers into the fins, to form the PTSLs with an abrupt profile. The PTSLs are formed in only portions the fins directly under the respective openings, i.e., portions of the fins directly under respective channel regions, without doped regions of the PTSLs formed beneath the respective source/drain regions, as shown in FIGS. 9, 9A and 9B. In this way, the junction leakage and the junction capacitance are reduced, thereby improving the performances of the device. When ions are implanted, due to the presence of the spacers 114, a part of the implanted ions are reflected from the spacers 114 into the respective fins 106, to form reflection doped regions 142 in portions of the respective fins on inner sides of the respective source/drain regions, resulting in doped regions on opposite sides of each of the channel regions. The reflection doped regions 142 have relatively smaller doping concentration than that of the PTSLs 140, but have relatively larger doping concentration than other regions between the PTSLs and the channels. Due to the presence of the reflection doped regions 142 having the relatively large doping concentration, it is beneficial to improve the threshold voltages of the devices. With the continuous scaling down of the device, the reflection doped regions on opposite sides of the channel become increasingly closer to each other until they overlap with each other. At this time, the doping concentration in the channel can effectively suppress threshold voltage roll-off, and thus improve the short channel effects of the device.

After the PTSLs are formed by ion implantation, the dummy gate dielectric layers 110 of $SiO_2$ may be removed by dilute HF, to form a dielectric material with a higher quality.

Thus, the PTSLs according to the embodiment of the present disclosure are formed, and then other processes may be implemented for the devices.

Figure 11:
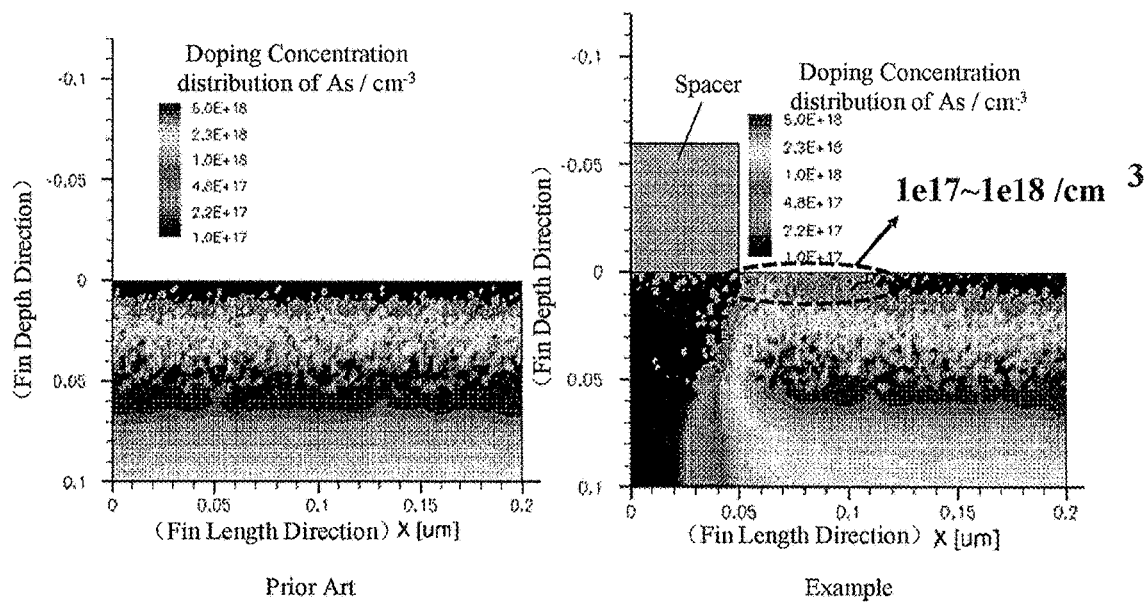
FIG. 11 is a diagram showing a comparison of doping concentration distribution in a fin between a PTSL transistor in the related art and a PTSL transistor according to an embodiment of the present disclosure.

As shown in FIG. 11, illustrated is a diagram showing a comparison of doping concentration distribution in the fin between a PTSL transistor in the related art and a PTSL transistor according to an embodiment of the present disclosure. Here, the so called PTSL transistor in the related art means that a PTSL is formed in the entire fin after an isolation layer is formed. In contrast, for the PTSL transistor according to the embodiment of the present disclosure, the PTSL is formed after the dummy gate is removed. In the related art and the embodiment of the present disclosure, As ions are implanted under the same implantation conditions, i.e., at energy of 70 keV and a dosage of 1E13/$cm^2$ and at an angle of 0 degree. It can be seen that in the related art, the formed PTSL has a doping concentration in a range of 3E18/$cm^3$ to 5E18/$cm^3$, and there is a doped region in an upper portion of the channel region, which has a relatively small doping concentration with a relatively uniform lateral distribution. However, in the embodiment of the present disclosure, the PTSL has a doping concentration in a range of $3E18/cm^3$ to $5E18/cm^3$, and there is a doped region at the edge of the channel region (as indicated by the dotted block), which has a doping concentration (for example, in a range of about $1E17/cm^3$ to $1E18/cm^3$) smaller than that of the PTSL but relatively higher than those of other regions with a relatively concentrated distribution. This region is a reflection doped region formed by reflection from the spacer, which is beneficial to improve the threshold voltage of the device.

Figure 12:
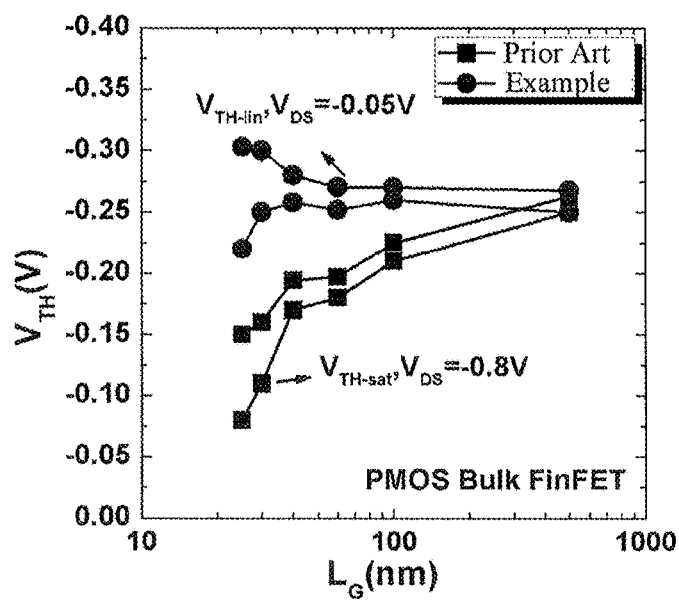
FIG. 12 is a diagram showing a comparison of threshold voltage roll-off between a PTSL transistor in the related art and a PTSL transistor according to an embodiment of the present disclosure.

As shown in FIG. 12, illustrated is a diagram showing a comparison of threshold voltage roll-off between a PTSL transistor in the related art and a PTSL transistor according to an embodiment of the present disclosure. It can be seen that for the transistor device in the related art, with the continuous scaling down of the gate (Lg), the threshold voltage ($V_{TH}$) shows apparent roll-off. In contrast, for the transistor device according to the embodiment of the present disclosure, with the continuous scaling down of the gate (Lg), the threshold voltage ($V_{TH}$) does not show apparent roll-off, which effectively improves the short channel effects of the device.

Figure 10:
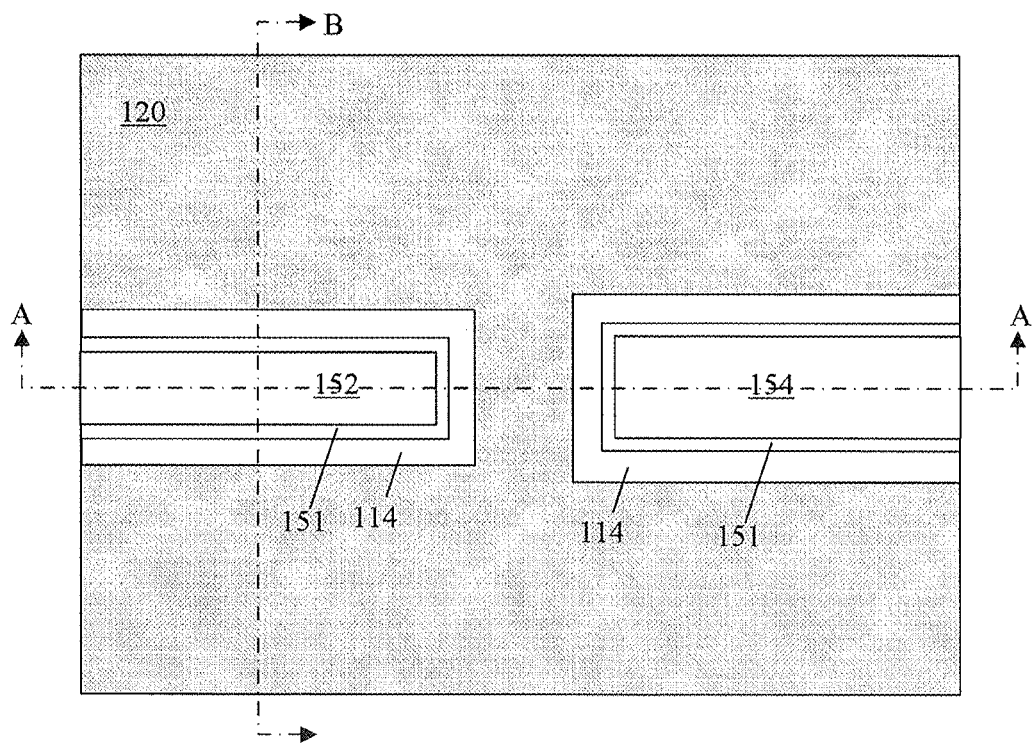
Figure 10A:
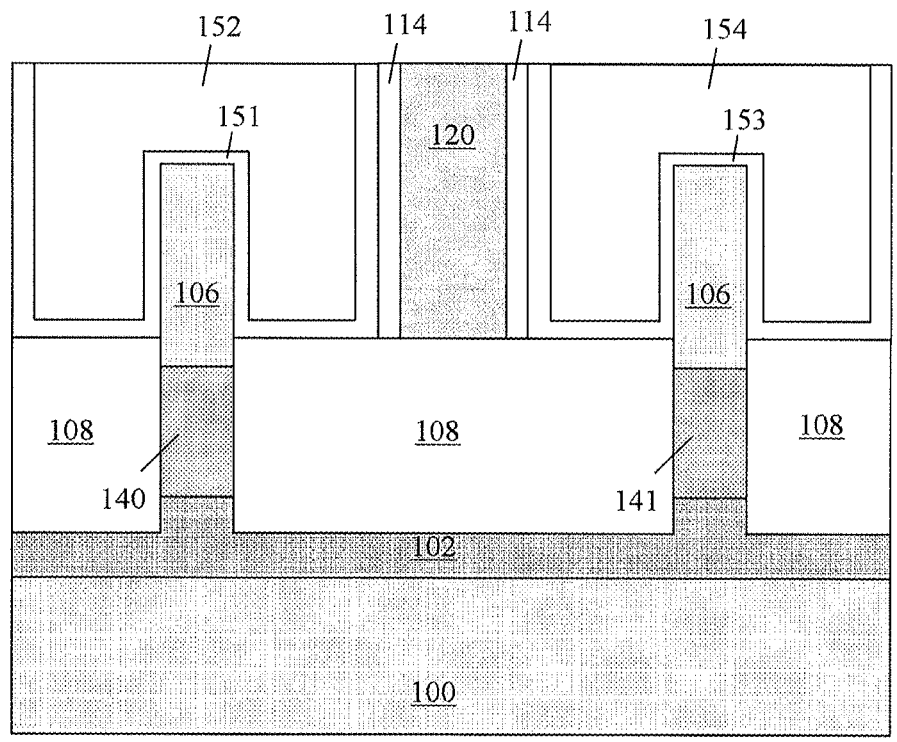

In step S05, replacement gates are formed in the openings, as shown in FIGS. 10, 10A (a sectional view along an AA direction in FIG. 10) and 10B (a sectional view along a BB direction in FIG. 10).

Figure 10B:
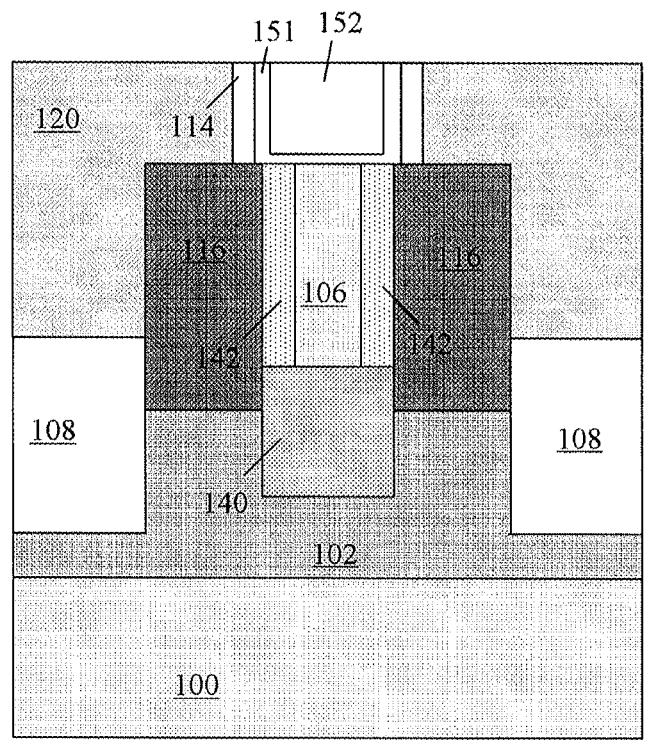

The replacement gates may be formed in a conventional way. In the present embodiment, a first replacement gate and a second replacement gate are formed in the first opening and the second opening, respectively. Specifically, a replacement gate dielectric layer 151 is firstly deposited. The gate dielectric layer 151 may comprise a high-k dielectric material (for example, a material with a higher dielectric constant compared with silicon oxide) or other suitable dielectric materials. For example, the high-k dielectric material may comprise hafnium based oxide, such as $HfO_2$, HfSiO, HfSiON, HfTaO, HfTiO or the like, and have a thickness of 1-3 nm. Then, a gate stack 152 for the first replacement gate and a gate stack 154 for the second replacement gate are formed, respectively. The gate stack may comprise a metallic material, for example, Ti, $TiAl_x$, TiN, $TaN_x$, HfN, $TiC_x$, $TaC_x$, W or the like. In a specific embodiment, a first metallic layer of $TiC_x$ or $TaC_x$ (not shown) is deposited in the first opening for the N-type device, and a second metallic layer of $TiAl_x$ or TiN (not shown) is deposited in the second opening for the P-type device. Then, a filler metal layer (not shown) is formed by filling the first opening and the second opening with W, and is planarized until the interlayer dielectric layer is exposed. In this way, the first replacement gate including the gate stack 152 of the first metallic layer and the filler metal layer is formed in the first opening, and the second replacement gate including the gate stack 154 of the second metallic layer and the filler metal layer is formed in the second opening, as shown in FIGS. 10, 10A and 10B. The structure and material of the replacement gate formed herein are merely illustrative, and a replacement gate with a desirable structure and material may be formed according to specific requirements. Thus, the FinFET according to the embodiment of the present disclosure is achieved.

In addition, the present disclosure further provides a FinFET formed by the method as described above. As shown in FIGS. 10, 10A and 10B, the transistor comprises a semiconductor substrate 100; fins 106 on the substrate, with isolation layers 108 formed therebetween; a device structure on each of the fins 108; and PTSLs 140 in portions of the respective fins 106 directly under respective gates 152 and 154, and reflection doped layers 142 in portions of the respective fins on inner sides of source/drain regions, wherein the reflection doped layer 142 has the same doping type as that of the PTSL 140.

The device structure comprises the gate 152 across the fin, a spacer 114 on the sidewalls of the gate, and source/drain regions 116 in the fin on opposite sides of the gate. The reflection doped layer 142 has a doping type the same as that of the PTSL 140 but different from that of the source/drain regions 116.

In the embodiment of the present disclosure, the reflection doped layer 142 and the PTSL 140 are formed in the ion implantation process, and the reflection doped layer is formed due to the reflection from the spacer during implantation. Thereby, the reflection doped layer has a relatively smaller doping concentration than that of the PTSL, but has a relatively larger doping concentration than those of other regions in the channel.

In the present embodiment, illustrated is a dual-gate device structure. A first type of device structure is formed on a fin in a region, and a second type of device structure is formed on another fin in another region.

The FinFET according to the present disclosure reduces the junction leakage and the junction capacitance, because the PTSLs are formed in only the portions of the fins directly under the respective gates and no doped region of the PTSLs is formed directly under the source/drain regions. In addition, the reflection doped regions are formed on opposite sides of the channel, which is beneficial to improve the threshold voltage of the device. Especially when the device shrinks continuously, the reflection doped regions on opposite sides of the channel become increasingly closer to each other. As a result, it is possible to suppress threshold voltage roll-off, and thus improve the short channel effects of the device.

Although the present disclosure has been described above with reference to some embodiments, the embodiments are not intended to limit the present disclosure. Various variations, modifications, and equivalents are possible without departing from the scope of the present disclosure. Therefore, such variations, equivalents, or modifications should fall within the scope of the present disclosure.

We claim:

1. A method of manufacturing a Fin Field Effect Transistor (FinFET), comprising:
   forming a fin on a semiconductor substrate and an isolation layer surrounding the bottom of the fin;
   forming a dummy device including a dummy gate on the fin;
   forming an interlayer dielectric layer to cover regions except for the dummy gate;
   removing the dummy gate to form an opening;
   implanting ions from above the interlayer dielectric layer with the opening therein to form a Punch-Through-Stop Layer (PTSL) in a portion of the fin directly under the opening, while forming reflection doped layers in portions of the fin on inner sides of source/drain regions; and
   forming a replacement gate in the opening.

2. The method according to claim 1, wherein the ions are implanted at a vertical angle.

3. The method according to claim 2, wherein the ions are implanted at a dosage in a range of $1E12\ cm^{-2}$ to $1E14\ cm^{-2}$ and energy in a range of 10 KeV to 150 KeV.

4. The method according to claim 1, wherein a first type of dummy device and a second type of dummy device are formed on respective fins.

5. The method according to claim 4, wherein a first replacement gate and a second replacement gate are formed in respective openings.

6. A Fin Field Effect Transistor (FinFET), comprising:
a semiconductor substrate;
a fin formed on the substrate;
an isolation layer surrounding the bottom of the fin;
a device structure including a gate on the fin and source/drain regions on opposite ends of the fin, with a channel region defined in the fin under the gate between the source/drain regions;
a Punch-Through-Stop Layers (PTSL) in a portion of the fin directly under the gate and beneath the channel region; and
reflection doped layers in portions of the fin on inner sides of source/drain regions and on opposite ends of the channel region, which ends face a respective one of the source/drain regions, and thus disposed between one of the source/drain regions and a corresponding one of the ends of the channel region and between the other of the source/drain regions and a corresponding one of the ends of the channel region, respectively, wherein the reflection doped layers have the same doping type as that of the PTSL.

7. The FinFET according to claim 6, wherein the device structure comprises a first type of device structure and a second type of device structure.

8. The FinFET according to claim 6, wherein the reflected doped layers extend along substantially an entire width of the channel region.

* * * * *